US 8,838,431 B1

(12) United States Patent
Mihalache et al.

(10) Patent No.: US 8,838,431 B1
(45) Date of Patent: Sep. 16, 2014

(54) MIXED-LANGUAGE SIMULATION

(75) Inventors: Valeria Mihalache, Santa Clara, CA (US); Hem C. Neema, Sunnyvale, CA (US); Kumar Deepak, San Jose, CA (US); Sonal Santan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 320 days.

(21) Appl. No.: 13/027,683

(22) Filed: Feb. 15, 2011

(51) Int. Cl.
*G06F 17/50* (2006.01)

(52) U.S. Cl.
USPC .............................................. 703/15; 716/106

(58) Field of Classification Search
None
See application file for complete search history.

(56) References Cited

U.S. PATENT DOCUMENTS

| | | | |
|---|---|---|---|
| 6,466,898 B1* | 10/2002 | Chan ................................ | 703/17 |
| 6,807,520 B1* | 10/2004 | Zhou et al. ....................... | 703/14 |
| 7,181,383 B1* | 2/2007 | McGaughy et al. ............ | 703/14 |
| 7,191,412 B1 | 3/2007 | Lin et al. | |
| 7,681,184 B1* | 3/2010 | Weedon et al. ................ | 717/137 |
| 7,721,090 B1 | 5/2010 | Deepak et al. | |
| 7,979,820 B1* | 7/2011 | Patzer et al. ................... | 716/106 |
| 8,069,024 B1* | 11/2011 | Croix .............................. | 703/14 |
| 8,447,581 B1* | 5/2013 | Roth et al. ....................... | 703/14 |
| 2006/0259879 A1* | 11/2006 | Chetput et al. .................... | 716/2 |

FOREIGN PATENT DOCUMENTS

WO     WO 00/42535 A1     7/2000

OTHER PUBLICATIONS

Schwoerer, Ludwig et al., "Integration of VHDL into a System Design Environment," Proc. of the Conference on European Design Automation, Sep. 18, 1995, pp. 268-273, IEEE Computer Society Press, Los Alamitos, California, USA.*
Authors Unknown, Using Hierarchy and Isomorphism to Accelerate Circuit Simulation, White Paper, Cadence Design Systems, Inc., San Jose, CA, 2004.*
Berman, Victor, "Standard Verilog-VHDL Interoperability," *Proc. of the VHDL International Users Forum*, May 1, 1994, pp. 142-149, IEEE Computer Society Press, Los Alamitos, California, USA.
Schwoerer, Ludwig et al., "Integration of VHDL into a System Design Environment " *Proc. of the Conference on European Design Automation*, Sep. 18, 1995, pp. 268-273, IEEE Computer Society Press, Los Alamitos, California, USA.

* cited by examiner

*Primary Examiner* — Omar Fernandez Rivas
*Assistant Examiner* — Robert Brock
(74) *Attorney, Agent, or Firm* — Leroy D. Maunu

(57) ABSTRACT

In one embodiment, a method is provided for generating dataflow-driven simulation code of a circuit design described with a combination of first and second HDLs. The circuit description is elaborated and a simulation dataflow graph of the circuit description is generated. Simulation code, configured to model execution of the design in a data-driven manner according to the simulation dataflow graph, is generated from the dataflow graph using a first HDL signal representation having a format compatible with the first HDL and a second HDL signal representation having a format compatible with the second HDL. For each instantiated module of the circuit description at a cross language boundary in the simulation dataflow graph, ports of the instantiated module are mapped to the first HDL signal representation and mapped to the second HDL signal representation.

20 Claims, 5 Drawing Sheets

MIXED-LANGUAGE SIMULATION

FIELD OF THE INVENTION

One or more embodiments generally relate to the simulation of circuit designs.

BACKGROUND

Due to advancements in processing technology, complex integrated circuits (ICs) can be designed using various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through combinatorial modules from one set of registers to another set of registers. HDLs provide a rich set of constructs to describe the functionality of a module. Modules may be combined and augmented to form even higher level modules.

To reduce design costs, designers often incorporate previously created designs that have been provided either from within an enterprise or from a commercial provider. Libraries of pre-developed blocks of logic have been developed that can be selected and included in a circuit design. Such library modules include, for example, adders, multipliers, filters, and other arithmetic and digital signal processing (DSP) functions from which system designs can be readily constructed. The engineering community sometimes refers to these previously created designs as "IP cores" (intellectual property cores), or "logic cores," and such terms may be used interchangeably herein. The use of pre-developed logic cores permits faster design cycles by eliminating the redesign of circuits. Thus, using cores from a library may reduce design costs.

Prior to implementation, an HDL design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Due to object-oriented reuse of design code, an HDL design often contains modules written in different HDLs. Two commonly used HDLs are VHDL (VHSIC (Very High Speed Integrated Circuits) hardware description language) and Verilog. HDL specifications that utilize two or more HDLs may be referred to as mixed-language designs. A module defined in one language can include another module of either language as a sub-module, with no restriction on either the depth of the instantiation hierarchy or the number of times the design hierarchy switches language type. Signals used as ports in module instantiations can pass language boundaries as well, with no restrictions other than those imposed by the design. For ease of explanation, examples and embodiments are primarily described using a mixed-language where each module of the design is described with either the Verilog or the VHDL language. As used herein, VHDL components and Verilog modules are referred to generically as modules.

Mixed-language designs can be difficult to simulate efficiently, due to the differing formats and capabilities of the different HDLs. One solution for mixed-language simulation performs code generation (i.e., executable/assembly/object code generation from HDL for effecting compiled code simulation) on a per module basis. During code generation, a distinctive representation is generated for each of the Verilog and VHDL modules instantiated. These module-based representations are read in at run time and used to effect the simulation. In such models, the port connections to convert and propagate signals between the Verilog and VHDL modules are configured during simulation runtime, often creating new signals that may increase simulation workload. To handle data type conversion and complex port connections necessary to propagate signals across language boundaries, additional implicit HDL processes may be needed to map and convert signals appropriately. The combined effect of handling signal propagation and additional HDL processes increases simulation complexity and memory requirements, and reduces simulation runtime efficiency.

SUMMARY

In one embodiment, a method is provided for generating simulation code of a circuit design described with a combination of first and second HDLs. The circuit description is elaborated and a simulation dataflow graph of the circuit description is generated. Simulation code, configured to model execution of the design according to the simulation dataflow graph, is generated from the dataflow graph. The simulation code uses a first HDL signal representation having a format compatible with the first HDL and a second HDL signal representation having a format compatible with the second HDL. For each instantiated module of the circuit description at a cross language boundary in the simulation dataflow graph, ports of the instantiated module are mapped to the first HDL signal representation and mapped to the second HDL signal representation.

In another embodiment, a method of generating simulation code of a circuit description having at least one module described in a combination of first and second HDLs is provided. The circuit description is elaborated and a simulation dataflow graph of the circuit description is generated. The simulation dataflow graph is generated by modeling a datapath through modules of the first HDL using at least a first dataflow builder, and modeling the datapath through modules of the second HDL using at least a second dataflow builder. Simulation code, configured to model execution of the design according to the simulation dataflow graph, is generated from the dataflow graph.

In yet another embodiment, an article of manufacture is provided. The article is characterized by a non-transitory processor-readable storage medium configured with processor-executable instructions for processing a circuit description. When the instructions are executed by a processor, the instructions cause the processor to elaborate the circuit description and generate a simulation dataflow graph of the circuit description. The simulation dataflow graph is generated by modeling a datapath through modules of the first HDL using at least a first dataflow builder and modeling the datapath through module of the second HDL using at least a second dataflow builder. The datapath through modules of the first HDL is modeled using dataflow builders in two traversals of the circuit description. In a first traversal of the circuit description, dataflow nets of modules of the first HDL are inferred using the first dataflow builder in a first traversal of the circuit description. In a second traversal of the circuit description, processes are generated for each module of the first HDL, drivers of the nets of the first HDL are generated, and sensitivity of processes of the modules of the first HDL is determined. Once the dataflow graph is created, simulation code, configured to model execution of the design according to the simulation dataflow graph, is generated.

It will be appreciated that various other embodiments are set forth in the Detailed Description and Claims, which follow.

BRIEF DESCRIPTION OF THE DRAWINGS

Various aspects and advantages will become apparent upon review of the following detailed description and upon reference to the drawings, in which.

DETAILED DESCRIPTION

Dataflow modeling provides an efficient way to simulate HDL designs. In a dataflow model, a circuit is modeled in terms of the dataflow between registers and the manner in which a design processes data, rather than instantiation of individual gates. A dataflow simulator is characterized in that simulation code is executed in a manner that follows the data (i.e., the signal flow inside and across HDL modules). To optimize data creation while satisfying this property, single-language simulators typically propagate a signal between modules via instantiation without creating a new signal data structure for the newly instantiated module. The simulator reuses the data structures from the instantiating module. However, when a signal crosses between modules based on different HDLs, the signal data structures of the two models are not compatible. Previous mixed-language simulators typically address this issue by creating new signals and runtime helper processes to handle signal conversion and propagation when a module of a different HDL type is instantiated. These new signals and runtime processes result in an increase in workload and memory requirements of the simulator.

One or more embodiments provide a method to generate runtime-efficient code for a mixed-language dataflow simulation. During compilation, a dataflow representation is created in a manner that minimizes the number of signal representations, and the conversion of signals across HDL language boundaries is pre-configured. No additional processes are required to be created at runtime to handle propagation of signals across language boundaries of the mixed-language specification. Instead, the inherent complexities of signal propagation across language boundaries are handled at compile time during the phases of creating the signal dataflow and generating simulation code. The result is a mixed-language simulator with a significantly improved runtime performance and memory footprint.

Figure 1:
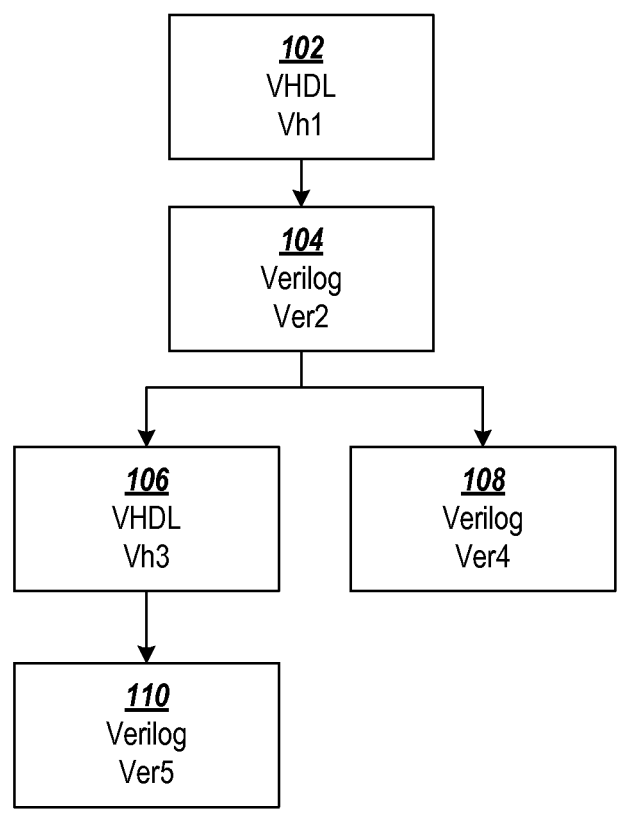
FIG. 1 shows an example mixed-language circuit description hierarchy.

FIG. 1 shows an example mixed-language circuit description. In this example, the HDL specification includes a top-level VHDL module Vh1 (102). The Vh1 module instantiates a Verilog module Ver2 (104). The Verilog module instantiates a VHLD module Vh3 (106) and a Verilog module Ver4 (108). The Vh3 module further instantiates Verilog module Ver5 (110). The depth of the HDL design hierarchy in this example is limited to four levels for ease of explanation. In practice, there are no HDL design rules limiting the number of times a signal crosses language boundaries when instantiating modules. As a result, large HDL designs may cross boundaries a large number of times and require a large number of signal conversions.

One or more embodiments improve simulator efficiency for signal propagation across language boundaries in a mixed-language dataflow simulator by creating, for each signal crossing language boundaries, one Verilog representation and one VHDL representation. At compile time, the Verilog representation of the signal is created by the Verilog dataflow builder that is active—as it would be in a single language Verilog simulator—and a VHDL representation is created by the VHDL dataflow builder that is active—as it would be in a single language VHDL simulator. If a signal crosses language boundaries multiple times, then the representation previously created for the corresponding HDL is used. Reusing the dataflow signals ensures that signal creation for ports is optimal in the mixed-language simulator.

During the code generation phase, transaction functions may be generated to control updating of the VHDL and Verilog portions of the mixed-language signal during simulation. The transaction functions are configured to wake up/schedule VHDL and Verilog processes that are sensitive to this signal. This architecture ensures that the compiler builds a minimal amount of data for each mixed-language signal. This in turn reduces the amount of signal-encoding data that is required to be processed at runtime.

Figure 2:
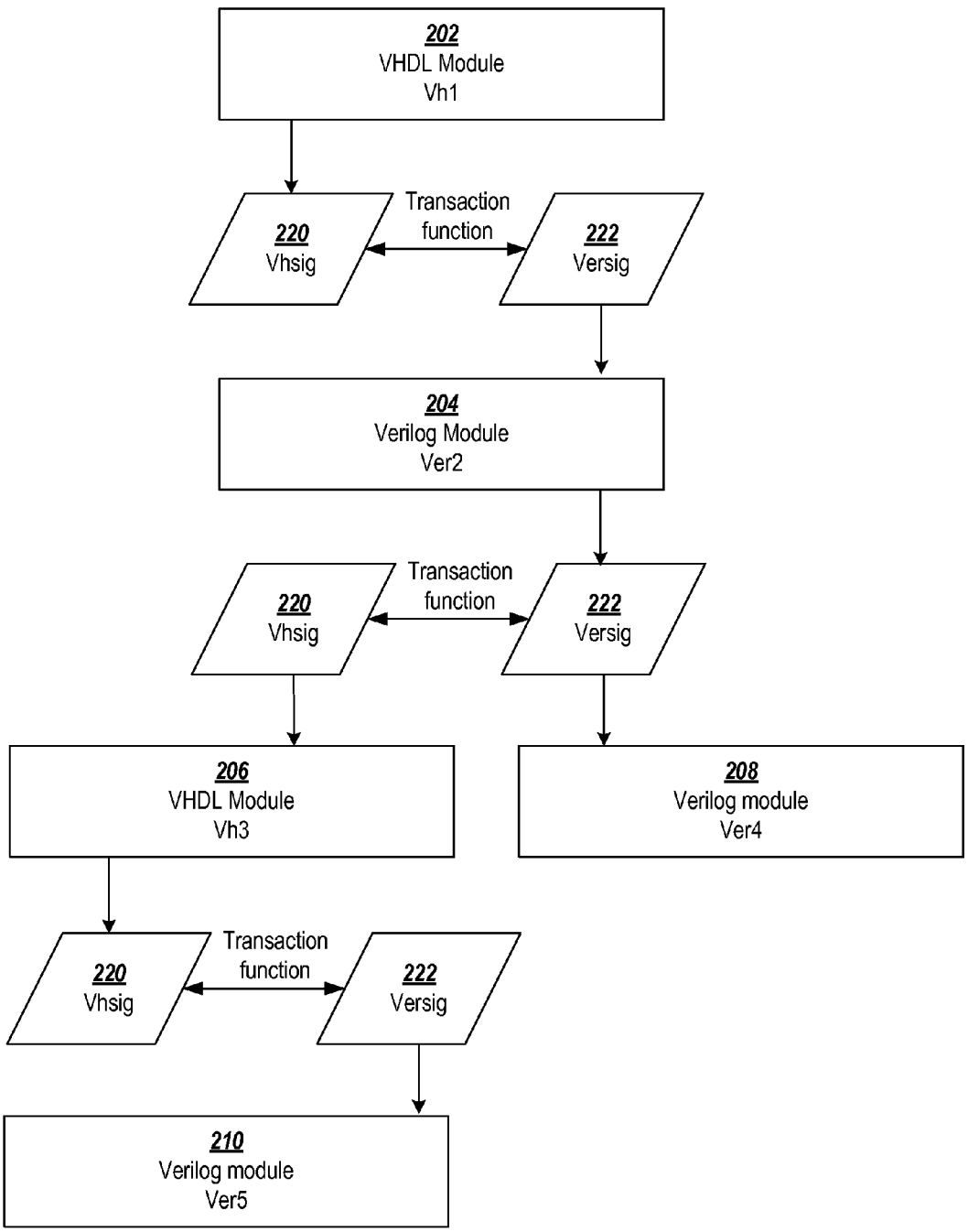
FIG. 2 illustrates signal propagation between modules of the mixed-language circuit description shown in FIG. 1.

FIG. 2 illustrates signal propagation between modules of the mixed-language circuit description shown in FIG. 1. In this example, two signal representations Vhsig 220 and Versig 222 are used to represent a dataflow of a signal through modules 202, 204, 206, 208, and 210. VHDL modules are simulated using the Vhsig 220 signal representation and Verilog modules are simulated using Versig 222 signal representation. VHDL ports are mapped to Verilog signals during compilation. A transaction function generated during compilation is configured to update one of the signal representations in response to a change in the other.

For example, during simulation Vhsig 220 is used to represent a signal which is generated by VHDL module Vh1 202. VHDL module 202 is simulated using signal Vhsig 220, and Verilog modules Ver2 204, Ver4 208, and Ver5 210 are simulated using the Verilog signal representation Versig 222 for their respective signals. When Vhsig is updated following simulation of Vh1 202, the transaction function updates also Versig 222. For clarity, signals such as Vhsig 220 may also be used to represent output signals, inout signals, or locally declared signals in the module in addition to input signals In a mixed-language simulation, changes in a signal used across language boundaries must be propagated to all Verilog and VHDL modules that access that signal. Changes in such a signal that happen on the Verilog side should be immediately available on the VHDL side, and changes to the signal on the VHDL side should be immediately visible on the Verilog side.

One or more embodiments address this issue by reserving two memory locations for each signal that is passed across language boundaries: one Verilog-type location, and one VHDL-type location. At runtime, when a Verilog module modifies the Verilog representation of the signal, the change is written in the Verilog-type memory location. In the same delta cycle, i.e., the same modeled time period in which the Verilog representation of the signal is propagated, the transaction function converts the Verilog value to a VHDL value, and writes the converted value to the VHDL-type location of the signal. Similarly, when a VHDL module changes the signal at runtime, the change is written to the VHDL-type memory location, converted and stored in the Verilog-type location associated with the signal. This ensures that when a Verilog module is executed, the simulator uses the most recent value of the signal and can compare it to its previous value to check for a change in value. Similarly, when a VHDL module is executed, the latest VHDL value of the signal is readily available, as it would be in a single language VHDL flow. Because the transaction function is configured to convert and update each signal pair, when a signal is accessed at runtime while inside a Verilog module, the simulator is not required to account for mixed-language signals.

Figure 3:
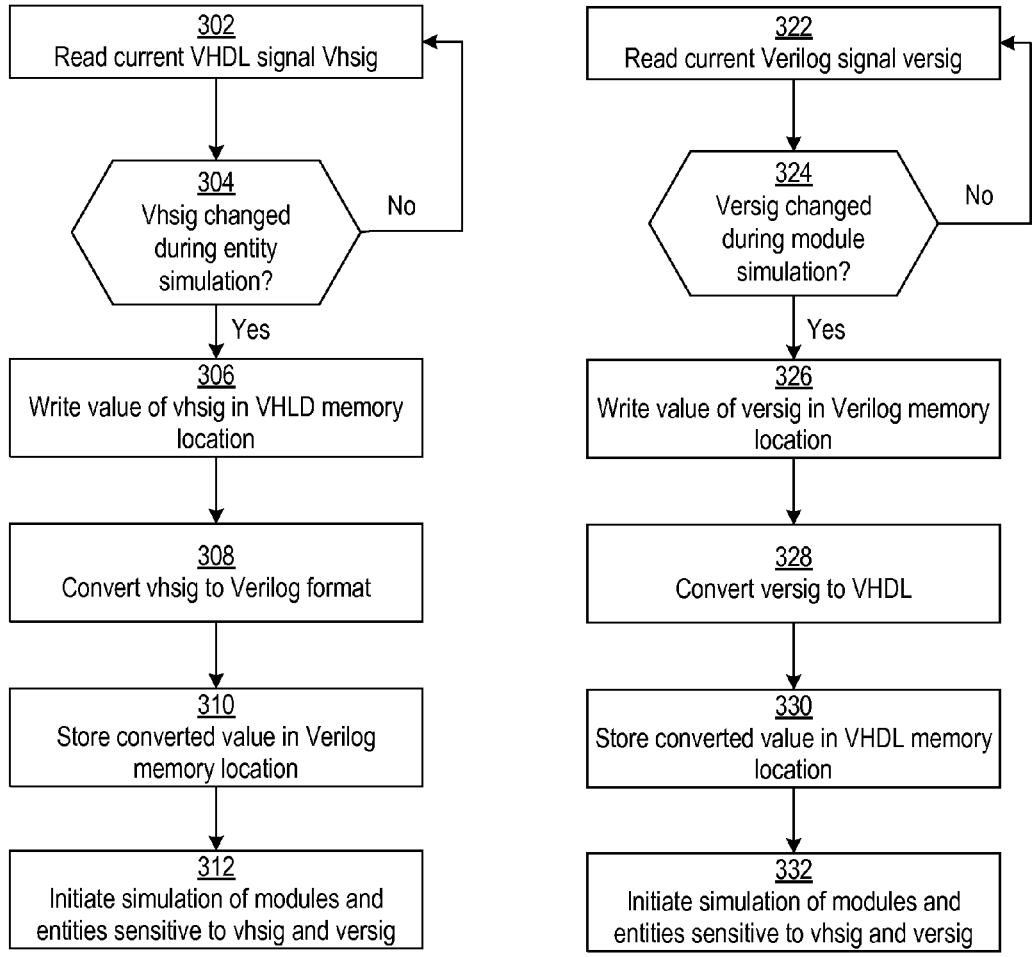
FIG. 3 shows a flowchart of an example implementation of a transaction function that may be pre-configured during compilation to efficiently convert signals at cross-language boundaries during simulation.

FIG. 3 shows a flowchart of an example process performed by a transaction function that may be generated and configured during compilation to efficiently update signal representations at cross-language boundaries during simulation. The VHDL signal is monitored at blocks 302 and 304, and in response to a modification to the signal Vhsig, the transaction function is configured to write the value of Vhsig to a VHDL format memory location at block 306. At block 308, the transaction function converts Vhsig to a Verilog format using the conversion determined during compilation. The converted value is stored in a Verilog format memory location at block 310. After the values have been written to memory at blocks 306 and 310, the transaction function initiates execution of processes indicated by the dataflow graph as being sensitive to either Vhsig or Versig at block 312.

Similarly, the Verilog signal Versig is monitored at blocks 322 and 324. In response to a modification to the Versig signal, the transaction function is configured to write the value of Versig to a Verilog format memory location at block 326. At block 328, the transaction function converts Versig to a VHDL format, using the conversion determined during compilation. The converted value is stored in a VHDL format memory location at block 330. After the values have been written to memory at blocks 326 and 330, the transaction function initiates execution of processes indicated by the dataflow graph as being sensitive to either Vhsig or Versig at block 332.

In one or more embodiments, a dataflow representation of the fully elaborated mixed-language design may be generated by using single-language Verilog and VHDL dataflow builders to infer nets, create processes, create drivers of nets, and determine sensitivity for each module in the fully elaborated mixed-language design. A dataflow graph may be generated for mixed-language HDL specification by traversing a design and modeling the dataflow of signals through VHDL modules using VHDL builders, and through Verilog modules using Verilog dataflow builders.

Due to the additional inherent complexities of cross-module references, a Verilog dataflow-centric simulator needs to traverse the design top-down twice. Each traversal is realized using a separate dataflow builder, and therefore a Verilog dataflow-centric simulator uses two dataflow builders in order to determine dataflow through Verilog modules.

One or more embodiments generate a mixed-language dataflow model using four dataflow builders. Two data builders process the VHDL modules of the design, and the other two process the Verilog modules of the design. Because the Verilog part of the mixed-language design must be processed by Verilog simulation dataflow builders and the VHDL part of the design must be processed by VHDL dataflow builders, a mixed-language simulator needs at least three dataflow builders: two Verilog builders and one VHDL builder. Two Verilog builders are needed in order to preserve the separation of information. As the design is traversed, a VHDL builder is used to traverse the VHDL part of the design, and a Verilog builder is used to traverse the Verilog part of the design. Thus, a full traversal of the design makes use of at least one VHDL builder and at least one Verilog builder.

Because two traversals of the Verilog portion of design hierarchy are needed, a second VHDL builder is needed to traverse VHDL portions of the design hierarchy. Consequently, a mixed-language dataflow graph can be generated using two VHDL builders and two Verilog builders in two traversals of the design. Identical code may be used to implement the first and second Verilog dataflow builders as well as the first and second VHDL dataflow builders. However, these are disjoint structures in that there is no information sharing between them. In practice, the first Verilog dataflow builder may be deleted before creating the second Verilog dataflow builder.

When the design is traversed, the appropriate VHDL or Verilog dataflow builder is selected based on the HDL types of each instantiated module. For example, if the top module is written in the VHDL language, a VHDL dataflow builder is created and used to traverse the HDL design hierarchy, top-down, until a Verilog module is instantiated. In response to encountering a Verilog module, a Verilog dataflow builder is created and used to continue traversal of the design hierarchy under the Verilog module. The design is traversed using the Verilog dataflow builder until a Verilog module instantiates a VHDL module. At that time, the previously created VHDL dataflow builder may be used to traverse the VHDL hierarchy under this VHDL module. Traversal continues using the VHDL dataflow builder until another Verilog module instantiation is encountered. In response to encountering a Verilog module, the previously created Verilog dataflow builder is used to continue traversing the hierarchy. Control switches between the VHDL dataflow builder and the Verilog dataflow builder as many times as necessary. During this traversal, the VHDL dataflow builder performs a number of tasks for each of the VHDL modules processed, including: inferring nets, generating processes to implement statements of the modules in simulation, creating drivers of nets having signals that are modified by each of the modules, and determining the sensitivity of each of the generated process signals of the inferred dataflow nets. For each of the Verilog modules, the Verilog dataflow builder is used to infer dataflow nets. As mentioned above, due to inherent complexities of cross-module references, a second traversal is needed to create processes and net drivers, and to determine sensitivity of nets for each Verilog module.

Once the first traversal of the hierarchical design is completed, a second VHDL dataflow builder is created and may be used for a shallow traversal of the design hierarchy, top-down, starting from the top-level VHDL module. Shallow traversal refers to a design traversal in which the VHDL processes, signal assignments and declarations are not processed. In a shallow traversal, instantiation statements are identified and parsed until an instantiation of a Verilog module is encountered. In response to encountering a Verilog module instantiation, a second Verilog dataflow builder is created and used to traverse the Verilog hierarchical design under this instantiated module.

During this second traversal, the second Verilog dataflow builder performs a number of tasks for each of the Verilog modules processed, including creating of processes of the module, creating drivers of nets, and determining the sensitivity of each process to the dataflow nets. Like the first traversal, control switches back and forth between the second Verilog and VHDL dataflow builders at cross-language boundaries as the design hierarchy is traversed.

Figure 4:
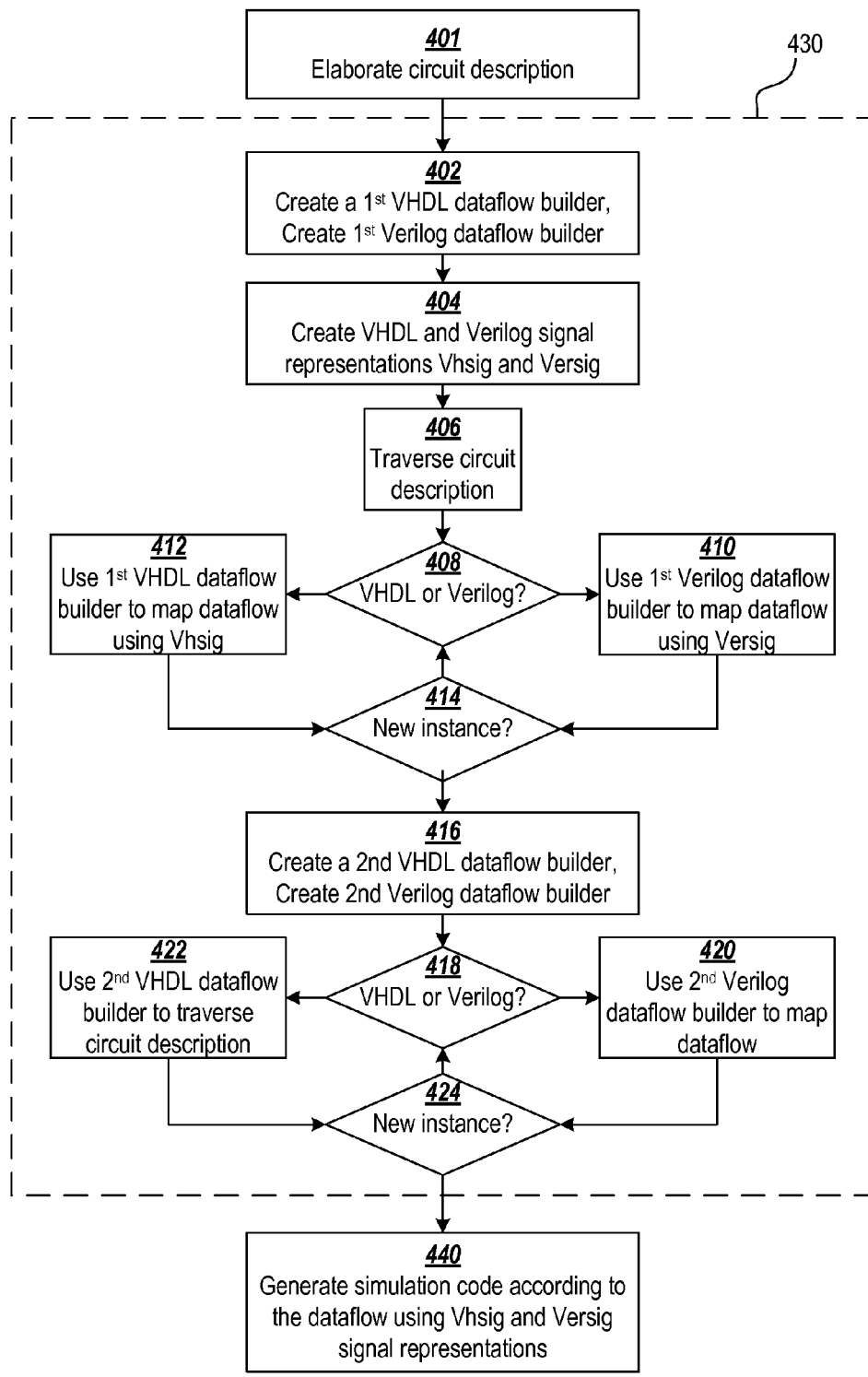
FIG. 4 shows a flowchart of an example process for compiling a mixed-language circuit description.

FIG. 4 shows a flowchart of an example process for compiling a mixed-language circuit description. The circuit description is elaborated at block 401. A dataflow diagram of the mixed-language HDL description is generated in the example processes shown in block 430. A VHDL dataflow builder and a Verilog dataflow builder are created at block 402. A VHDL signal Vhsig and a Verilog signal Versig are created at block 404. In this example, a signal representation and dataflow builder are created before traversing the mixed-language design. In some implementations, a first signal representation and dataflow builder are generated when a module of a first one of the HDLs is encountered. The second signal representation and dataflow builder are generated if and when a module of a different HDL is encountered.

A first traversal of the fully elaborated design is initiated at block 406. For each Verilog block encountered at decision step 408 during the first traversal, the first Verilog dataflow builder is used to solve a first set of dataflow problems at block 410. As described above, the first dataflow builder is used to infer a dataflow net of the Versig signal. For each VHDL block encountered at decision step 408 during the first traversal, the first VHDL dataflow builder is used to map dataflow of the Vhsig signal representation at block 412. As described above, over the first traversal, the VHDL dataflow builder infers nets of the Vhsig, creates processes included in the module, creates drivers of nets, and determines the sensitivity of each of the processes to the dataflow nets.

Whenever a new instance of a module is encountered at decision step 414, the appropriate dataflow builder is selected at decision step 408 for dataflow graph creation. When the first traversal of the HDL specification is completed at decision step 414, a second VHDL dataflow builder and a second Verilog dataflow builder are created at block 416. The elaborated design is traversed a second time and the second dataflow builders are used to complete the dataflow graph of the HDL specification. For each Verilog block encountered at decision step 418, the second Verilog dataflow builder is used to complete the Verilog dataflow graph using the Versig signal at block 420. As described above, the second Verilog dataflow builder creates processes of the module, creates drivers of nets, and determines the sensitivity of each process to the dataflow nets created in the first traversal at block 410. For each VHDL module, the second VHDL dataflow builder allows the full specification to be traversed by performing a shallow traversal of each VHDL model at block 422, in which only instantiation statements inside the VHDL module are processed in detail.

Simulation code, configured to model execution of modules and according to the simulation dataflow graph, is generated at block 440 using a first HDL signal representation having a format compatible with the first HDL and a second HDL signal representation having a format compatible with the second HDL. For each instantiated module of the circuit description at a cross language boundary in the simulation dataflow graph ports of the instantiated module are mapped to the first HDL signal representation and mapped to the second HDL signal representation.

While the examples and embodiments are primarily described in the context of a mixed-language design expressed in VHDL and Verilog, it is recognized that the embodiments may be used in connection with simulation of mixed-language specifications containing other HDL languages as well as or instead of VHDL and Verilog. Similarly, while the above examples and embodiments are described with reference to one top-level module, it is recognized that one or more embodiments can be easily extrapolated for designs with multiple top-level modules.

Figure 5:
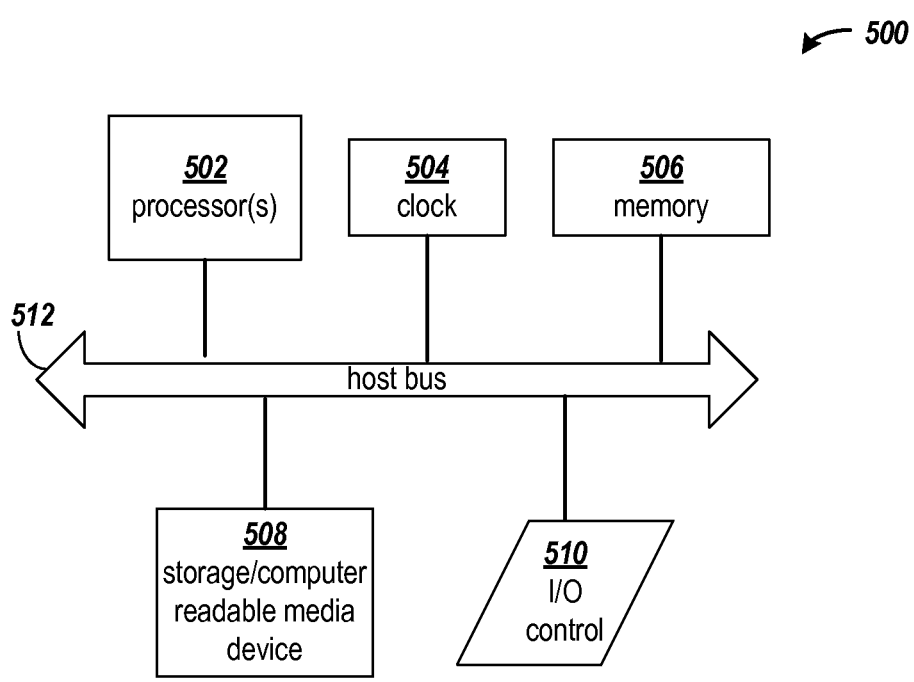
FIG. 5 shows a computer architecture that may be configured to implement the processes and functions described herein.

FIG. 5 shows a block diagram of an example computing arrangement that may be configured to implement the processes and functions described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory unit 506, a storage unit 508, and an input/output control unit 510 coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements, as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

The embodiments may be applicable to a variety of systems for HDL simulation. Other aspects and embodiments will be apparent from consideration of the specification. It is intended that the specification and illustrated embodiments be considered as examples only, with a true scope and spirit of the embodiments being indicated by the following claims.

What is claimed is:

1. A method of generating simulation code of a circuit description having at least a first plurality of modules described with a first hardware descriptive language (HDL) and at least a second plurality of modules described with a second HDL different from the first HDL, the method comprising:
    performing, on at least one programmed processor, operations including:
        generating a simulation dataflow graph of the circuit description; and
        generating simulation code from the dataflow graph, the simulation code modeling execution of modules in a data-driven manner according to the simulation dataflow graph, the generating of the simulation code including:
for a signal that is propagated from a first module of the first plurality of modules to a second module of the second plurality of modules and propagated from the second module to a third module of the first plurality of modules, wherein the second module is a sub-module of the first module, and the third module is a sub-module of the second module in a hierarchy of modules:
creating a first HDL signal representation and storing the first HDL signal representation in a first memory location and having a format compatible with the first HDL;
creating a second HDL signal representation and storing the second HDL signal representation in a second memory location and having a format compatible with the second HDL for the signal; and
for instances of the first, second, and third modules of the circuit description in the simulation dataflow graph:
mapping ports of instances of the first and third modules to the first HDL signal representation stored in the first memory location; and
mapping a port of an instance of the second module to the second HDL signal representation stored in the second memory location.

2. The method of claim 1, wherein the generating of the simulation code further includes:
generating a first transaction function configured to, in response to a change in value of the first HDL signal representation in the first memory location during simulation:
convert the value of the first HDL signal representation from the first memory location to a first converted value of the format of the second HDL signal representation; and
update the second memory location with the first converted value; and
generating a second transaction function configured to, in response to a change in value of the second HDL signal representation in the second memory location during simulation:
convert the second HDL signal representation to a second converted value of the format of the first HDL signal representation; and
update the first memory location with the second converted value.

3. The method of claim 2, wherein:
the first transaction function is configured to complete conversion and update operations in a delta cycle during simulation in which the value of the first HDL signal representation changes; and
the second transaction function is configured to complete conversion and update operations in a delta cycle during simulation in which the value of the second HDL signal representation changes.

4. The method of claim 2, wherein:
the first transaction function is configured to wake each process of the first plurality of modules that is sensitive to the signal; and
the second transaction function is configured to wake each process of the second plurality of modules that is sensitive to the signal.

5. The method of claim 1, wherein the generating of the simulation dataflow graph of the circuit description includes:
modeling a datapath through modules described with the first HDL using a first dataflow builder; and
modeling the datapath through modules described with the second HDL using a second dataflow builder.

6. The method of claim 5, wherein the modeling of the datapath through modules described with the first HDL includes:
inferring dataflow nets of modules described with the first HDL using a first dataflow builder in a first traversal of the circuit description; and
in a second traversal of the circuit description, using a third dataflow builder to perform steps including:
creating processes for each module described with the first HDL;
creating drivers of the nets associated in the first HDL; and
determining sensitivity of processes of the modules described with the first HDL.

7. The method of claim 6, wherein the modeling of the datapath through modules described with the second HDL includes:
using the second dataflow builder in the first traversal of the circuit description to perform steps including:
inferring dataflow nets of modules described with the second HDL;
creating processes for each module described with the second HDL;
creating drivers of the nets associated in the second HDL; and
determining sensitivity of processes of the modules described with the second HDL; and
using a fourth dataflow builder to perform a shallow traversal of modules described with the second HDL.

8. The method of claim 6, wherein the second traversal of the circuit description traverses only instantiation statements of the circuit description.

9. The method of claim 1, wherein the first HDL signal representation in the first memory location and the second HDL signal representation in the second memory location are used only for the signal.

10. A method of generating simulation code of a circuit description having at least a first plurality of modules described with a first hardware descriptive language (HDL) and at least a second plurality of modules described with a second HDL that is different from the first HDL, the method comprising:
performing, on at least one programmed processor, operations including:
generating a simulation dataflow graph, the generating including:
modeling a datapath through modules described with the first HDL using a first dataflow builder; and
modeling the datapath through modules described with the second HDL using a second dataflow builder;
generating simulation code from the dataflow graph, the generated code being executable to simulate a circuit operating according to the circuit description, wherein the generating simulation code includes:
for a signal that is propagated from a first module of the first plurality of modules to a second module of the second plurality of modules and propagated from the second module to a third module of the first plurality of modules, wherein the second module is a sub-module of the first module, and the third module is a sub-module of the second module in a hierarchy of modules:

creating a first signal representation compatible with the first HDL and storing the first HDL signal representation in a first memory location and creating a second signal representation compatible with the second HDL and storing the second HDL signal representation in a second memory location;

generating a first transaction function that is configured to, in response to a change in value of the first signal representation in the first memory location during simulation, convert the value of the first signal representation to a first converted value of the format of the second signal representation and update the second memory location with the first converted value; and generating a second transaction function that is configured to, in response to a change in value of the second signal representation in the second memory location during simulation, convert the value of the second signal representation to a second converted value of the format of the first signal representation and update the first memory location with the first converted value; and for instances of the first, second, and third modules of the circuit description in the simulation dataflow graph:

mapping ports of instances of the first and third modules to the first HDL signal representation stored the first memory location; and mapping a port of an instance of the second module to the second HDL signal representation stored in the second memory location.

11. The method of claim 10, wherein the modeling of the datapath through modules described with the first and second HDLs include:
inferring dataflow nets;
creating processes for each module;
creating drivers of the nets; and
determining sensitivity of each process to the dataflow nets.

12. The method of claim 10, wherein the modeling of the datapath through modules described with the first HDL includes:
inferring dataflow nets of modules described with the first HDL using the first dataflow builder in a first traversal of the circuit description; and
in a second traversal of the circuit description, using a third dataflow builder to perform steps including:
creating processes for each module described with the first HDL;
creating drivers of the nets associated with the first HDL; and
determining sensitivity of processes of the modules described with the first HDL.

13. The method of claim 12, wherein the modeling of the datapath through modules described with the second HDL includes:
using the second dataflow builder in the first traversal of the circuit description to perform steps including:
inferring dataflow nets of modules described with the second HDL;
creating processes for each module described with the second HDL;
creating drivers of the nets associated with the second HDL; and
determining sensitivity of processes of the modules described with the second HDL; and
using a fourth dataflow builder to perform a shallow traversal of modules described with the second HDL.

14. The method of claim 13, wherein the second traversal of the circuit description traverses only instantiation statements of the circuit description.

15. The method of claim 12, wherein the first HDL is Verilog and the second HDL is VHDL.

16. The method of claim 10, wherein:
the transaction function is configured to complete conversion and update operations in one delta cycle during simulation in which the signal represented by the first and second signal representations is modified.

17. The method of claim 10, wherein the transaction function is configured to wake each process that is specified in the first plurality of modules and is sensitive to the signal and wake each process that is specified in the second plurality of modules and is sensitive to the signal.

18. An article of manufacture, comprising:
a non-transitory processor-readable storage medium configured with processor-executable instructions for processing a circuit description, the instructions when executed by a processor causing the processor to perform steps including:
elaborating a circuit description having at least a first plurality of modules described with a first hardware descriptive language (HDL) and at least a second plurality of modules described with a second HDL;
generating a simulation dataflow graph, the generating including:
modeling a datapath through modules described with the first HDL using a first dataflow builder by performing operations including:
inferring dataflow nets of modules described with the first HDL using the first dataflow builder in a first traversal of the circuit description; and
in a second traversal of the circuit description, using a third dataflow builder to perform steps including:
creating processes for each module described with the first HDL;
creating drivers of the nets associated with the first HDL; and
determining sensitivity of processes described with the modules of the first HDL; and
modeling the datapath through modules described with the second HDL using a second dataflow builder; and
generating simulation code from the dataflow graph, the simulation code being used to execute the circuit description;
wherein the generating simulation code includes:
for a signal that is propagated from a first module of the first plurality of modules to a second module of the second plurality of modules and propagated from the second module to a third module of the first plurality of modules, wherein the second module is a sub-module of the first module, and the third module is a sub-module of the second module in a hierarchy of modules:
creating a first signal representation compatible with the first HDL and storing the first HDL signal representation in a first memory location and creating a second signal representation compatible with the second HDL and storing the second HDL signal representation in a second memory location;

generating a first transaction function that is configured to, in response to a change in value of the first signal representation in the first memory location during simulation, convert the value of the first signal representation to a first converted value of the format of the second signal representation and update the second memory location with the first converted value; and generating a second transaction function that is configured to, in response to a change in value of the second signal representation in the second memory location during simulation, convert the value of the second signal representation to a second converted value of the format of the first signal representation and update the first memory location with the first converted value; and for instances of the first, second, and third modules of the circuit description in the simulation dataflow graph:

mapping ports of instances of the first and third modules to the first HDL signal representation stored the first memory location; and mapping a port of an instance of the second module to the second HDL signal representation stored in the second memory location.

19. The article of claim 18, wherein the modeling of the datapath through modules described with the second HDL includes:

using the second dataflow builder in the first traversal of the circuit description to perform steps including:

inferring dataflow nets of modules described with the second HDL;

creating processes for each module described with the second HDL;

creating drivers of the nets associated with the second HDL; and determining sensitivity of processes described with the modules of the second HDL; and using a fourth dataflow builder to perform a shallow traversal of modules described with the second HDL.

20. The article of manufacture of claim 18, wherein:

the first transaction function is configured to wake each process that is specified in the first plurality of modules and is sensitive to the signal; and the second transaction function is configured to wake each process that is specified in the second plurality of modules and is sensitive to the signal.

* * * * *